(12) United States Patent
Demir

(10) Patent No.: US 7,187,732 B2
(45) Date of Patent: Mar. 6, 2007

(54) START-UP AUTOMATIC FREQUENCY CONTROL (AFC) METHOD AND APPARATUS

(75) Inventor: Alpaslan Demir, Ronkonkoma, NY (US)

(73) Assignee: InterDigital Technology Corporation, Wlimington, DE (US)

( * ) Notice: Subject to any disclaimer, the term of this patent is extended or adjusted under 35 U.S.C. 154(b) by 0 days.

(21) Appl. No.: 10/629,429

(22) Filed: Jul. 29, 2003

(65) Prior Publication Data

US 2004/0022333 A1 Feb. 5, 2004

Related U.S. Application Data

(60) Provisional application No. 60/399,818, filed on Jul. 31, 2002.

(51) Int. Cl.
H04L 27/06 (2006.01)

(52) U.S. Cl. ........................ 375/344; 375/149; 375/150; 375/226; 375/367; 342/199; 342/352; 370/342; 370/503

(58) Field of Classification Search ................ 375/345, 375/149, 362, 371, 147, 334, 145, 222, 376, 375/156, 344, 150, 226, 367; 341/111; 370/342, 370/280, 335, 503; 455/334; 324/121 R, 324/199, 352
See application file for complete search history.

(56) References Cited

U.S. PATENT DOCUMENTS

| | | | | |
|---|---|---|---|---|
| 5,574,754 A | * | 11/1996 | Kurihara et al. ............ | 375/367 |
| 5,994,932 A | * | 11/1999 | Ando ......................... | 327/156 |
| 6,160,841 A | | 12/2000 | Stansell, et al. ............ | 375/148 |
| 6,222,874 B1 | | 4/2001 | Walley et al. ............... | 375/149 |
| 6,236,343 B1 | * | 5/2001 | Patapoutian ................. | 341/111 |
| 6,313,789 B1 | | 11/2001 | Zhodzishsky et al. . | 342/357.12 |
| 6,327,257 B1 | | 12/2001 | Khalifa ....................... | 370/342 |
| 6,480,558 B1 | | 11/2002 | Ottosson et al. | |
| 6,532,255 B1 | * | 3/2003 | Gunzelmann et al. ...... | 375/150 |
| 6,597,729 B1 | * | 7/2003 | Schmidl et al. ............. | 375/149 |
| 6,775,318 B2 | * | 8/2004 | Chen et al. ................. | 375/149 |
| 6,804,315 B2 | * | 10/2004 | Demir et al. ................ | 375/362 |
| 6,826,244 B2 | * | 11/2004 | Demir et al. ................ | 375/362 |
| 2001/0021199 A1 | * | 9/2001 | Lee et al. .................... | 370/503 |
| 2002/0064146 A1 | | 5/2002 | Okuyama .................... | 370/342 |
| 2004/0043746 A1 | | 3/2004 | Hiramatsu .................. | 455/574 |

FOREIGN PATENT DOCUMENTS

| EP | 1 071 224 | | 1/2001 |
|---|---|---|---|
| GB | 2377126 A | * | 12/2002 |

\* cited by examiner

Primary Examiner—Chieh M. Fan
Assistant Examiner—Ted M. Wang
(74) Attorney, Agent, or Firm—Volpe and Koenig, P.C.

(57) ABSTRACT

Method and apparatus for adjusting the frequency of a voltage controlled oscillator (VCO) at a receiver to synchronize the receiver with the transmitter by correlating a synchronization code channel with training sequences to estimate positive and negative offsets which are employed to estimate an error, which is then filtered. The filter output provides voltage controlling the VCO. The same technique may be employed to control a numeric controlled oscillator (NCO).

12 Claims, 3 Drawing Sheets

PHASE ROTATION APPROACH FOR START_UP AFC

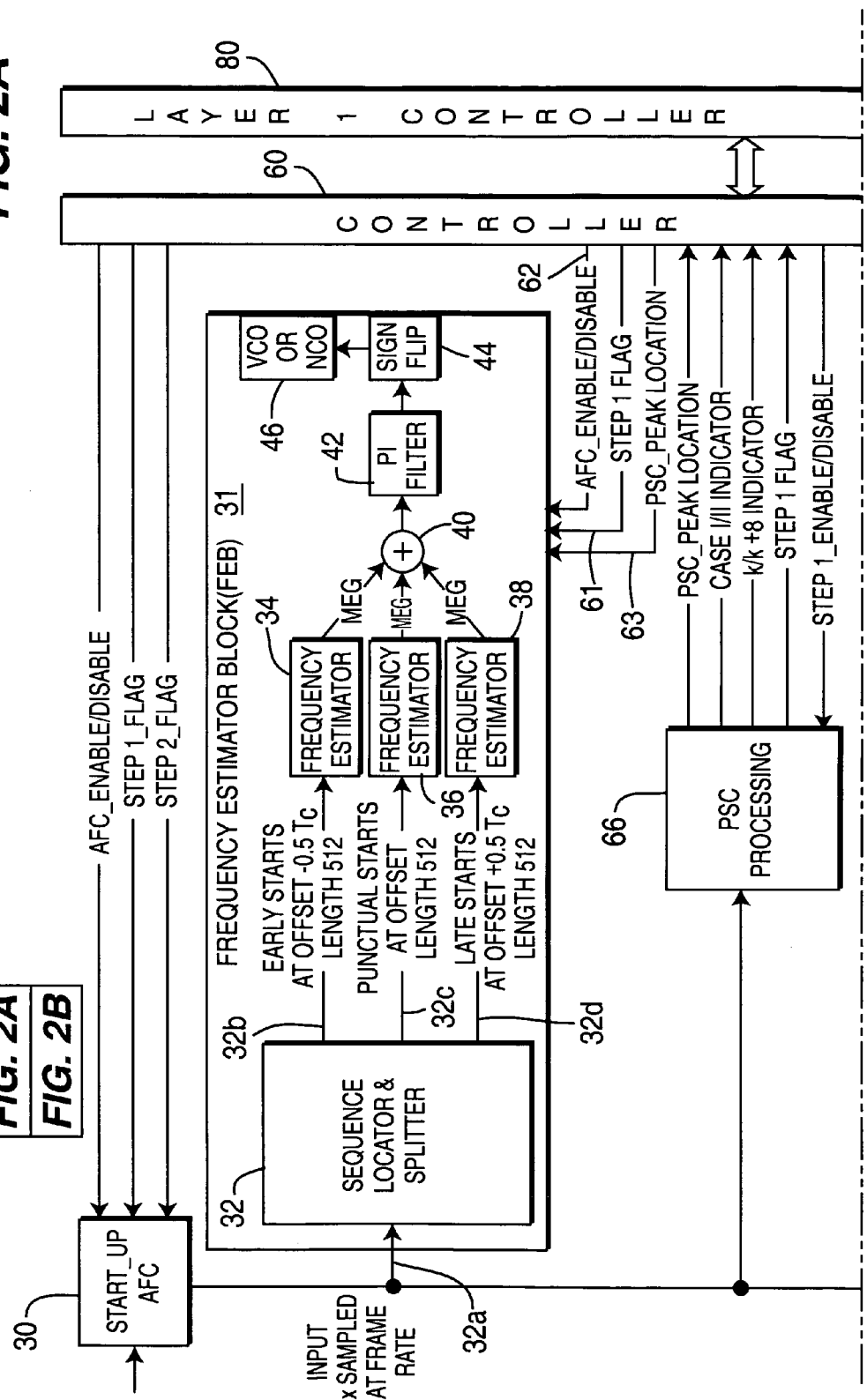

START-UP AUTOMATIC FREQUENCY CONTROL (AFC) METHOD AND APPARATUS

CROSS REFERENCE TO RELATED APPLICATION(S)

This application claims priority from U.S. provisional application No. 60/399,818 filed on Jul. 31, 2002, which is incorporated by reference as if fully set forth.

FIELD OF THE INVENTION

The invention relates to a wireless communication system. More particularly, the invention relates to initialization of a communication link between a base station (BS) and a user equipment (UE).

BACKGROUND OF THE INVENTION

During an initial cell search (ICS) or power-up of a UE, a training sequence of known symbols is used by the receiver to estimate the transmitted signal. In a time division duplex (TDD) signal, for example, the midamble of a TDD frame conventionally contains the training sequence of symbols. The conventional cell search process consists of a Step 1 algorithm which processes a primary synchronization code (PSC) on the primary synchronization code channel (PSCH) for synchronization channel (SCH) location determination. A Step 2 algorithm processes the secondary synchronization codes (SSC) for code group determination and timeslot synchronization, and a Step 3 algorithm performs midamble processing.

Variable control oscillators (VCOs) are commonly used at the end of an automatic frequency control (AFC) process to adjustably control the frequency of the receiver to achieve synchronization between a transmitter and a receiver. The input for the VCO is a control voltage signal, which is typically generated by a control circuit that processes the amplitude and phase of the received symbols. A common problem during an AFC process is the initial fluctuations resulting from a potentially significant frequency offset between the transmitter and the receiver.

SUMMARY

A method and apparatus for adjusting the frequency of a VCO at a receiver to synchronize the receiver with the transmitter by correlating a synchronization code channel with training sequences to estimate positive and negative offsets which are employed to estimate an error, which is then filtered. The filter output provides a voltage controlling the VCO. The same technique may be employed to control a numeric controlled oscillator (NCO).

BRIEF DESCRIPTION OF THE DRAWINGS

The invention will be understood from the following description and drawings in which like elements are designated by like numerals and, wherein:

FIGS. 2A and 2B, taken together, comprise a block diagram of the interaction between start-up AFC and algorithm Steps 1, 2 and 3 of cell search.

FIG. 2 shows the manner in which FIGS. 2a and 2b are arranged to create a complete block diagram.

DETAILED DESCRIPTION OF THE PREFERRED EMBODIMENT(S)

Figure 1:
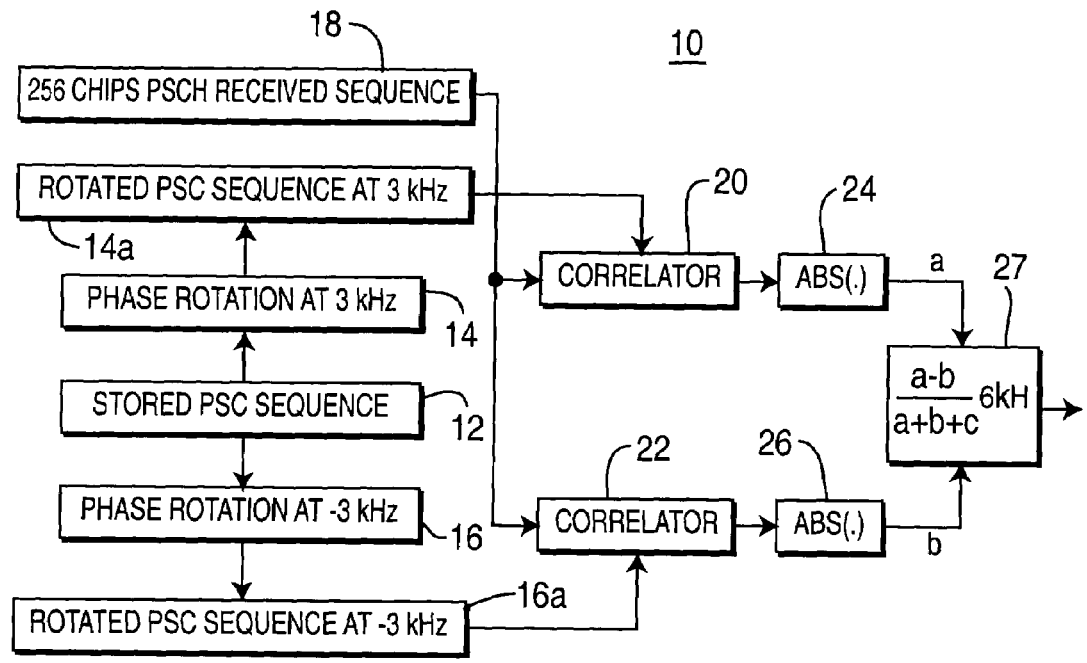
FIG. 1 is a block diagram showing the phase rotation approach for startup AFC.

FIG. 1 is a block diagram of a start-up adaptive frequency control (AFC) 10 used to reduce the frequency offset between a base station (BS) and user equipment (UE) during initial cell search procedure. Start-up AFC uses a phase rotation approach, which is based on the correlations of two sequences with the primary synchronization code (PSC). The stored PSC sequence 12 is rotated in opposing directions at 14, 14a, 16, 16a to respectively determine correlations with the received sequence 18 at 20 and 22. The absolute values (a and b) are obtained at 24 and 26 and to obtain the value $$\left(\frac{a-b}{a+b+c}\right)6 \text{ kHz},$$

from circuit 27, where c is an arbitrary constant provided to prevent division by zero. The phase rotation at −3 kHz alternatively can be replaced by a conjugate of a rotated PSC sequence at 3 kHz since the PSC sequence can only have values of (1+j) and (−1−j).

During start-up AFC process, it is assumed that the PSC location provided is correct. Once Step 1 completes generation of the first outputs, the start-up AFC starts running. The Step 1 process and start-up AFC process run in parallel. Optimally, start-up AFC reduces the frequency offset from 6 kHz to less than 2 kHz in the least number of iterations. Table 1 shows a particular advantage of frequency correction which is an increase in allowable integrations. The number of integrations is limited, however, due to chip slip. The chip-slip upper bound is 0.5Tc since the maximum correlation is generated one sample later for a method utilizing twice the chip rate sampling. Table 1 summarizes the allowable number of integrations as frequency offset is reduced. Table 2 provides information on performance degradation for a coherent combining technique in the presence of carrier frequency offset.

TABLE 1

Frequency Offset vs. Number of Integration Allowed

| Frequency Offset | Slip per frame | Number of integrations allowed |
|---|---|---|
| ±6 kHz = ±3 ppm | 0.1152 Tc | 4 |
| ±4 kHz = ±2 ppm | 0.0768 Tc | 6 |
| ±2 kHz = ±1 ppm | 0.0384 Tc | 13 |
| ±1 kHz = ±0.5 ppm | 0.0192 Tc | 26 |

TABLE 2

Frequency Offset vs. Code Length for Coherent Combining

| Loss in dB | Length of the code integrated coherently | Carrier frequency Offset Fc = 2 GHz | |
|---|---|---|---|
| 2.42 | 256 | ±3 ppm | 6 kHz |
| 1.04 | 256 | ±2 ppm | 4 kHz |
| 0.26 | 256 | ±1 ppm | 2 kHz |
| 0.06 | 256 | ±0.5 ppm | 1 kHz |
| 12.62 | 512 | ±3 ppm | 6 kHz |
| 4.53 | 512 | ±2 ppm | 4 kHz |
| 1.04 | 512 | ±1 ppm | 2 kHz |
| 0.26 | 512 | ±0.5 ppm | 1 kHz |

The start-up AFC procedure includes a mechanism to realign the primary synchronization code (PSC) position that may shift during correction. The Step 1 procedure can be run to eliminate the need for the mechanism while the start-up AFC algorithm is running. The Step 1 procedure updates the peak location every 4th frame.

Figure 2B:
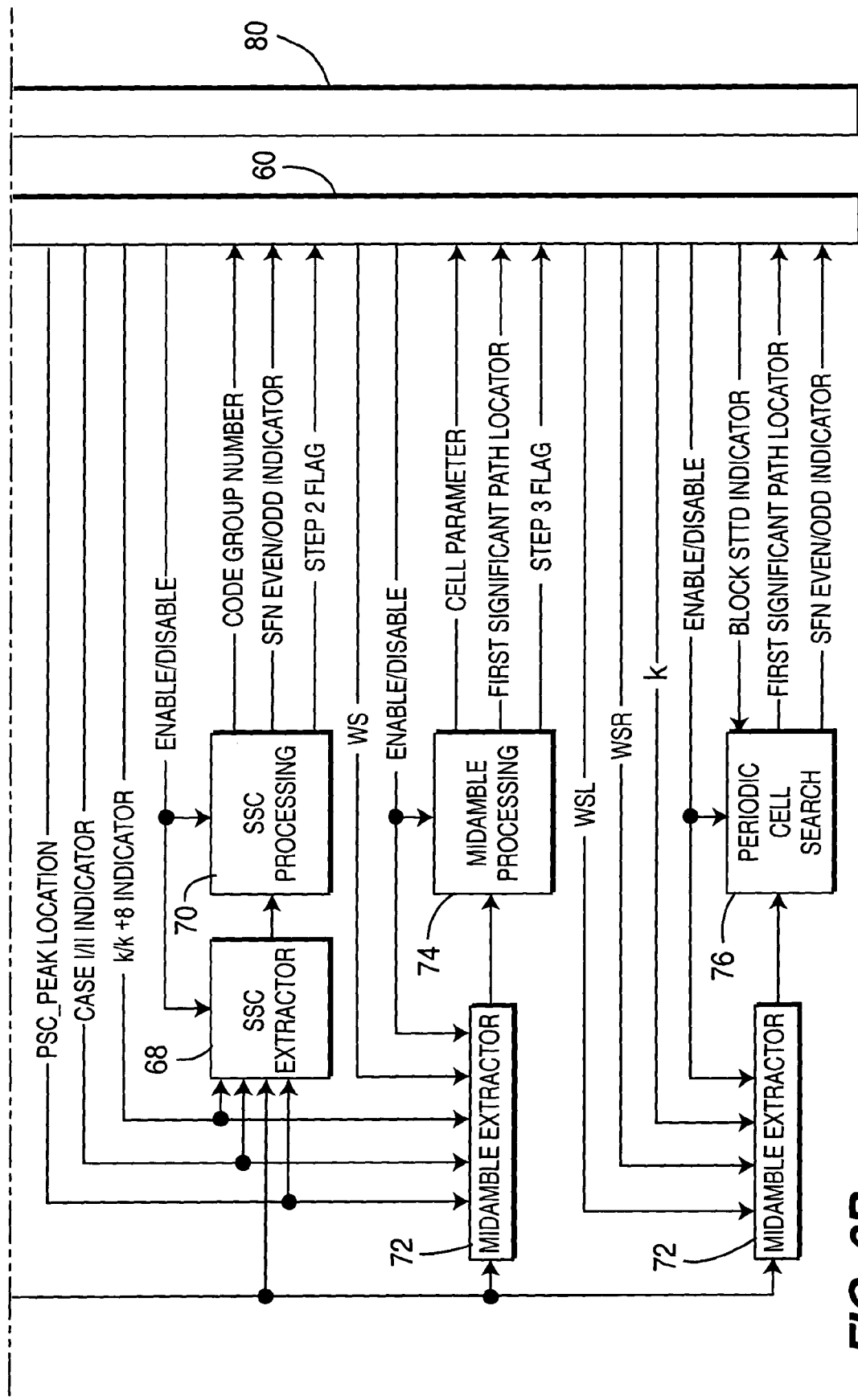

FIG. 2 depicts the parallel processing relationship among start-up AFC and Steps 1, 2 and 3 of cell searching. Of particular concern is the relationship between Step 1 and start-up AFC. Since Step 1 works in parallel with the startup AFC, there is no need for a code tracker circuit to follow a given path. Each time Step 1 updates an output that is based on the largest detected value, start-up AFC uses the new peak location to estimate the new frequency offset.

The frequency estimator block (FEB) 31 of the start-up AFC comprises a Sequence Locator and Splitter 32, frequency estimators 34–38, a proportional plus integral (PI) filter 42, and a voltage controlled oscillator (VCO) or numeric controlled oscillator (NCO) 46 coupled to PI filter 42 through the sign flop 44. The input 32a to the Sequence Locator and Splitter 32 includes the PSC peak location chip-offset provided by Step 1. Start up AFC 30 is an open loop gain control block that steps through pre-defined gain levels in order to set proper input power level before digitizing the input. The main input to both Step 1 and the Sequence Locator and Splitter 32 is sampled at twice the chip rate with a length of 76,800 complex elements. Since the chip-offset points to the peak location, the beginning of the PSC is 511 samples before the chip-offset. The outputs of the Sequence Locator and Splitter 32 are generated by the following general equation:

$$\text{Output} = \text{input}[i-511]i \qquad \text{Eq. (1)}$$

Accordingly, the three particular outputs of the Sequence Locator and Splitter 32 are represented by the following equations for early (32b), punctual (32c) and late 32(d) estimates:

$$\text{Early}[i] = \text{input}[i-511]i = \text{offset}-1, \text{offset}, \text{offset}+1, \ldots, \text{offset}+510 \qquad \text{Eq. (2)}$$

$$\text{Punctual}[i] = \text{input}[i-511]i = \text{offset}, \text{offset}+1, \text{offset}+2, \ldots, \text{offset}+511 \qquad \text{Eq. (3)}$$

$$\text{Late}[i] = \text{input}[i-511]i = \text{offset}+1, \text{offset}+2, \text{offset}+3, \ldots, \text{offset}+512 \qquad \text{Eq. (4)}$$

Although the Locator and Splitter 32 in the example given in FIG. 2, is a PSC locator, it should be understood the same approach can be used with any received sequences other than PSC.

The input samples to the Sequence Locator and Splitter are taken at twice the chip rate.

The frequency estimators 34, 36 and 38 each receive one of the three inputs provided by Equations (2)–(4). The frequency estimators estimate a different frequency offset, summed at 40, for each input sequence in accordance with FIG. 1. The frequency offset, summed at 40, is the summation of early, punctual and late estimates.

Figure 3:
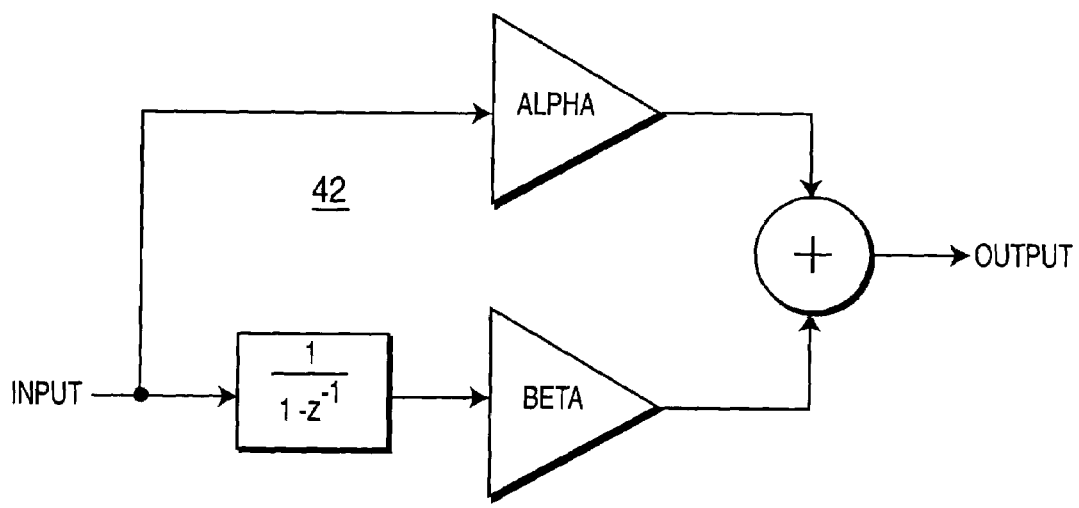
FIG. 3 shows a process diagram for a PI filter.

The sum of the estimates is passed through a proportional plus integral (PI) filter 42 with coefficients alpha and beta, respectively as shown in detail in FIG. 3. The PI filter bandwidth has two settings. Initially, alpha and beta are preferably $1/12$ and $1/256$, respectively as shown in detail in FIG. 3. The loop gain k is set at (k=−1.0). During steady state, alpha and beta are set to $1/16$ and $1/1024$, respectively. FIG. 3 depicts such a PI filter structure 42. The preferable settings for coefficients alpha and beta are summarized in Table 3. However, other filters may be substituted for the PI filter.

TABLE 3

PI Filter Coefficients as a Function of Operating Conditions.

| Condition | alpha | beta |
|---|---|---|
| initial | 1/2 | 1/256 |
| steady state | 1/16 | 1/1024 |

Steady state condition is established when:
 the startup AFC completes at least ten (10) iterations;
 while the last eight (8) outputs (inputs to VCO) are put into a buffer of length eight (8); the difference between the absolute value of the average of the first half and that of the second half is within ±1 kHz; and
 the current output to the VCO is within ±1 kHz of the absolute value of the average of the second half.

For digital applications, a numerically controlled oscillator (NCO) is used in place of the VCO.

The start-up AFC algorithm relies on PSC location update to estimate the carrier frequency offset. Step 1 runs during frequency correction to update the PSC location. As such, it is preferable that start-up AFC is begun immediately following a successful Step 1 process, with Step 1 running in parallel. Step 1 continues to provide updated PSC locations once every N1 frames as per the Step 1 algorithm, where N1 is the maximum number of frames for averaging. Start-up AFC is run in this manner for a duration of L frames, with L=24 as the preferred value. The Step 1 FLAG 61 from controller 60 is set when a sequence is detected. The FEB 31 runs when the controller 60 provides an enable condition to FEB 31 at 62. Since the peak locations shift left or right in time, the Step 1 algorithm is run constantly. At the end of L frames, the startup AFC reduces the frequency offset to about 2 KHz in many cases, which provides considerable enhancement to the Step 2 performance. The inclusion of L frames contributes to the overall cell search delay budget and hence is chosen conservatively to be L=24.

PSC processing block 66 correlates against the primary synchronization code in (synchronization channel) (SCH) over frames. The SCH location is not known.

SSC extractor block 68 utilizes the SCH location and extracts only the SCH portion, which is then passed to SSC processing block 70.

SSC processing block 70 correlates against the secondary synchronization code in synchronization channel over SCH.

Midamble Extractor block 72 utilizes the SCH location and SSC processing results and extracts the midamble portion to pass to midamble processing block 74.

Midamble processing block 74 correlates against possible midambles given by SSC processing and picks the one with the highest energy.

Periodic Cell Search block 76 performs a process which constantly searches for the best base station for the given period.

Controller 60 coordinates among stages to synchronize to a base station.

Layer 1 Controller 80 coordinates all layer 1 related hardware and software in order to maintain proper operation in the receiver.

What is claimed is:

1. Apparatus for performing start-up automatic frequency control (AFC) during initial cell search (ICS) by a user equipment (UE) receiver, where the ICS comprises:
 a processor configured to process a received synchronization code sequence to provide a peak location of the received synchronization code sequence;

a first correlator for determining a correlation between the received synchronization code sequence and a sequence generated by the apparatus;

a second correlator for determining a correlation between the synchronization code sequence and a sequence equivalent to the generated sequence which has been altered in phase;

an error estimator for determining the error associated with the outputs of the first and second correlators;

said error estimator including:
   estimator circuitry configured to provide early, punctual and late offset estimates; and
   a summer configured to sum said early, punctual and late offset estimates to produce the error estimate;

a filter for selectively integrating the error estimate responsive to an initial or steady state conditions of the cell search process; and an oscillator configured to produce an adjusted frequency responsive to the integrated error estimate.

2. The apparatus of claim 1 wherein:
said oscillator is one of a voltage control oscillator (VCO) and a numeric controlled oscillator (NCO).

3. The apparatus of claim 2 wherein said estimator circuitry comprises:
an early estimator for providing an early estimate which is offset $-\frac{1}{2}\, T_C$ relative to a punctual estimate and a late estimator to provide a late estimate which is offset $+\frac{1}{2}\, T_C$ relative to the punctual estimate wherein $T_C$ is no greater than ½ of a sampling rate.

4. Apparatus for performing start up automatic frequency control (AFC) during an initial cell search (ICS) by a user equipment (UE) receiver comprising:
   a processor configured to process a received code sequence to provide a location of a synchronization channel;
   a sequence locator and splitter responsive to a location output of said processor configured to produce early, punctual and late frequency offsets based on the received sequence;
   first, second and third frequency estimators configured to determine respective early, punctual and late frequency estimates from said early, punctual and late offsets;
   a summer configured to sum the early, punctual and late frequency estimates to produce an error estimate;
   a filter for selectively integrating the error estimate; and
   an oscillator configured to produce an adjusted frequency of the receiver responsive to the integrated error estimate.

5. A method of performing start-up automatic frequency control (AFC) for use during initial cell search (ICS) processing by a user equipment (UE) receiver, the method comprising:
   (a) receiving a received primary synchronization code (PSC) sequence which has a received frequency, and processing the received PSC sequence to form a first estimate of the received frequency;
   (b) rotating a phase of a stored sequence at the estimated received frequency plus a given frequency amount, to form an increased rotated phase of the stored sequence;
   (c) rotating a phase of the stored sequence at the estimated received frequency minus the given frequency amount, to form a decreased rotated phase of the stored sequence;
   (d) correlating each of early, punctual and late offsets of the received PSC sequence with the increased rotated phase of the stored sequence, and correlating each of the early, punctual and late offsets of the received PSC sequence with the decreased rotated phase of the stored sequence;
   (e) combining respective pairs of correlations from step (d) to form early, punctual and late estimates, combining the early, punctual and late estimates, and producing a frequency adjustment value from the combined early, punctual and late estimates, and
   (f) revising the estimated received frequency and adjusting the UE receiver, responsive to the frequency adjustment value.

6. The method of claim 5, further comprising repeating steps (b) through (f) a preferred number of times.

7. The method of claim 6, wherein the preferred number of times is 24.

8. A user equipment (UE) for performing start-up automatic frequency control (AFC) during initial cell search (ICS) processing, the UE comprising:
   a receiver configured to receive a received primary synchronization code (PSC) sequence which has a received frequency;
   a processor configured to process the received PSC sequence to form a first estimate of the received frequency;
   an estimated frequency reviser configured to produce a frequency adjustment value;
   said estimated frequency reviser including:
      a first frequency estimator configured to produce an estimate of an early offset of the received PSC sequence;
      a second frequency estimator configured to produce an estimate of a punctual offset of the received PSC sequence;
      a third frequency estimator configured to produce an estimate of a late offset of the received PSC sequence; and
      a combiner configured to combine the estimates produced by said first, second and third frequency estimators to produce a combined error estimate from which the frequency adjustment value is produced; and
   a receiver adjuster configured to the UE receiver, responsive to the frequency adjustment value.

9. The UE of claim 8, wherein:
at least one of said frequency estimators includes:
   a storage device for storing a sequence;
   an increased phase rotator configured to rotate a phase of the stored sequence at the estimated received frequency plus a given frequency amount, to form an increased rotated phase of the stored sequence;
   a decreased phase rotator configured to rotate a phase of the stored sequence at the estimated received frequency minus the given frequency amount, to form a decreased rotated phase of the stored sequence;
   a first correlator configured to correlate the received PSC sequence with the increased rotated phase of the stored sequence;
   a second correlator configured to correlate the received PSC sequence with the decreased rotated phase of the stored sequence; and
   an integrator configured to combine correlations from said first and second correlators;
said combiner is confirmed as a summer; and
the receiver adjuster is one of a voltage controlled oscillator (VCO) and a numerical controlled oscillator (NCO).

10. The UE of claim 8, further comprising repeater circuitry configured to repetitively operate said estimated frequency reviser during ICS processing.

11. The UE of claim 10, further comprising a counter associated with said repeater circuitry to repetitively operate said estimated frequency reviser during ICS processing a preferred number of times.

12. A user equipment (UE) for performing start-up automatic frequency control (AFC) during initial cell search (ICS) Processing comprising:
- a receiver configured to receive a received primary synchronization code (PSC) sequence which has a received frequency;
- a processor configured to process the received PSC sequence to form a first estimate of the received frequency;
- a storage device configured to store a sequence;
- an increased phase rotator configured to rotate a phase of the stored sequence at the estimated received frequency plus a given frequency amount, to form an increased rotated phase of the stored sequence;
- a decreased phase rotator configured to rotate a phase of the stored sequence at the estimated received frequency minus the given frequency amount, to form a decreased rotated phase of the stored sequence;
- a first correlator configured to correlate the received PSC sequence with the increased rotated phase of the stored sequence;
- a second correlator configured to correlate received PSC sequence with the decreased rotated phase of the stored sequence;
- an integrator configured to combine the correlations from said first and second correlators to form a frequency adjustment value;
- an estimated frequency reviser configured to revise the estimated received frequency responsive to the frequency adjustment value;
- a receiver adjuster configured to the UE receiver, responsive to the frequency adjustment value;
- repeater circuitry configured to repetitively operate said phase rotators, correlators, integrator and estimated frequency reviser during ICS processing; and
- a counter associated with said repeater circuitry to repetitively operate said phase rotators, correlators, integrator and estimated frequency reviser during ICS processing a preferred number of times.

* * * * *

UNITED STATES PATENT AND TRADEMARK OFFICE
CERTIFICATE OF CORRECTION

PATENT NO. : 7,187,732 B2
APPLICATION NO. : 10/629429
DATED : March 6, 2007
INVENTOR(S) : Alpaslan Demir Page 1 of 1

It is certified that error appears in the above-identified patent and that said Letters Patent is hereby corrected as shown below:

At column 2, line 35, after the word "upper", delete "bound" and insert therefor --boundary--.

At column 2, Table I heading, line 1, before the word "Allowed", delete "Integration" and insert therefor --Integrations--.

At column 3, line 61, after the word "preferably", delete "1/12" and insert therefor --1/2--.

IN THE CLAIMS

At claim 2, column 5, line 21, after the word "voltage", delete "control", and insert therefor --controlled--.

At claim 2, column 7, line 10, after "(ISC)", delete "Processing" and insert therefor --processing--.

Signed and Sealed this

Eighteenth Day of September, 2007

JON W. DUDAS
*Director of the United States Patent and Trademark Office*